United States Patent [19]

Zell et al.

[11] Patent Number: 4,972,297

[45] Date of Patent: Nov. 20, 1990

[54] DEVICE FOR SHIELDING ASSEMBLIES HAVING MULTI-POLE PLUGS

[75] Inventors: Karl Zell, Niederpoecking; Leo Pelzl, Holzkirchen, both of Fed. Rep. of Germany

[73] Assignee: Siemens Aktiengesellschaft, Berlin & Munich, Fed. Rep. of Germany

[21] Appl. No.: 341,478

[22] Filed: Apr. 21, 1989

[30] Foreign Application Priority Data

May 4, 1988 [DE] Fed. Rep. of Germany ....... 3815189

[51] Int. Cl.[5] ............................................ H05K 9/00

[52] U.S. Cl. ................................ 361/424; 174/35 R; 174/51; 361/394

[58] Field of Search .................... 174/35 R, 35 C, 51; 439/65, 71, 101, 108, 609; 361/212, 220, 393, 394, 395, 399, 412, 413, 424

[56] References Cited

U.S. PATENT DOCUMENTS 4,630,175 12/1986 Lerude ................................ 361/424
4,631,641 12/1986 Brombal ............................. 361/424
4,754,101 6/1988 Stickney ............................. 361/424

FOREIGN PATENT DOCUMENTS 0175942 8/1985 European Pat. Off. .
0203404 4/1986 European Pat. Off. .

*Primary Examiner*—Gerald P. Tolin
*Attorney, Agent, or Firm*—Hill, Van Santen, Steadman & Simpson

[57] ABSTRACT

A device for shielding assemblies having multi-pole plugs. Shielding caps of multi-pole plugs having spring elements that, in the plugged-in condition of the plugs, press against contact elements oriented perpendicularly on a wiring board and connected to a grounded potential layer thereof. Metallic shielding surfaces that at least partially surround the assemblies are voltaically connected to the shielding caps with metallic connecting elements, preferably spring elements.

21 Claims, 2 Drawing Sheets

DEVICE FOR SHIELDING ASSEMBLIES HAVING MULTI-POLE PLUGS

BACKGROUND OF THE INVENTION

The present invention is directed to a device for shielding assemblies having multi-pole plugs whose shielding caps are provided with spring elements that, in the plugged-in condition of the plugs, press against contact elements that are oriented perpendicularly on a wiring board and are connected to a grounded potential layer thereof.

European patent application No. 86 105 939.2 discloses a device for connecting shielding caps of multi-poled plugs to the grounded potential layer of a wiring board. A plurality of contact elements are oriented perpendicularly on a wiring board. Multi-pole plugs are plugged onto one part of the contact elements that are predominantly fashioned as contact blades and the multi-pole plugs are correspondingly connected to one another via the wiring board. The plugs are either part of a plug-type connection or are used on an assembly motherboard as a connecting element to the wiring board. Spring elements are located at the shielding caps of the multi-pole plugs, these spring elements, in the plugged condition of the plugs, pressing resiliently against contact elements that are conductively connected to the grounded potential layer of the wiring board. Further, it is known to shield assemblies against emission of or irradiation with noise signals by use of metallic shielding elements that are connected to the grounded potential layer.

SUMMARY OF THE INVENTION

The object of the present invention is an improvement in designing and supplementing the device initially set forth for connecting shielding caps of multi-pole plugs to the grounded potential layer of a wiring board such that a complete shielding of the assembly can be realized in an optimally simple manner.

The present invention is a device for shielding assemblies having multi-pole plugs whose shielding caps are provided with spring elements that, in a plugged-in condition of the plugs, press against contact elements oriented perpendicularly on a wiring board and connected to a grounded potential layer thereof. The device has metallic shielding surfaces that at least partially surround the assembly which are voltaically connected to the shielding caps with metallic connecting elements.

The basic concept of the present invention is the arrangement of the connecting elements directly at the shielding caps of the plugs and/or at the metallic shielding surfaces of the assembly. As a result short electrical connections exist from the shielding cap of the plugs to the grounded potential layer of the wiring board and the shielding effect of the shielding surfaces of the assembly is improved.

Instead of the standard contact blades as contact elements of the wiring board, reinforcing plates as disclosed in German patent application No. P 34 32 367.8 can be provided for a suitable assembly spacing.

In an advantageous development of the present invention the metallic connecting elements are arranged at the shielding caps and/or at the metallic shielding surfaces of the assembly. Although this fundamentally applied to every type of connection (for example, spring elements can be located either at the shielding cap or at the shielding surfaces), the selection of the arrangement of the connecting elements allows for a shielding device that already exists in the basic equipment having of an optimally slight auxiliary performance to acquire a potential, complete shielding of the assembly with optimally few connecting elements or, in the best case, without connecting elements.

In order to provide a modular structure of the shielding elements, that is a shielding cap and shielding surfaces of the assembly, and in order to provide a simple accessibility of the electrical components located on the assembly for the purpose of maintenance and testing the assembly, the metallic connecting elements are advantageously fastened by a mechanically releasable connection and the shielding surfaces of the assemblies are divided into shielding sub-surfaces. The shielding sub-surfaces are each respectively equipped with metallic connecting elements mated to one another such that all shielding sub-surfaces of the assembly are voltaically connected to one another.

As a consequence of the simple, mechanical releasability of spring elements, these can be utilized as connecting elements in an especially advantageous manner.

When a modular structure of the shielding elements that is the shielding surfaces of the assembly and shielding caps, is not required, the outside shielding surfaces of the shielding caps of the plugs and the shielding surfaces of the assemblies for the upper side and under side of the assemblies are constructed as one piece. This represents the most economical solution; however, the assembly may be maintained and tested without shielding, at least at one side.

In a further, advantageous development of the present invention the shielding caps of the plug or the metallic shielding surfaces of the assemblies are equipped with at least one metallic connector element such that a shielding surface arranged in an assembly motherboard of the assembly is voltaically connected to the shielding cap or to the metallic shielding surfaces of the assembly. As a result, a shielding surface located in the assembly motherboard is connected via the shielding elements, that is the shielding surface of the assembly and shielding caps, directly to the grounded potential layer of the wiring board. This appears meaningful, for example when a shielding surface provided as a last wiring layer is applied directly on the wiring side of the assembly and, thus, additional shielding surfaces on this assembly side outside of the assembly can be omitted. The connecting elements of the shielding surfaces in the assembly to the shielding surfaces of the assembly can be advantageously formed as solder or spring elements. Accordingly, the assembly motherboard or shielding surface must have solder contacts or contact surfaces, or contact springs for the seating or acceptance of the spring elements.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
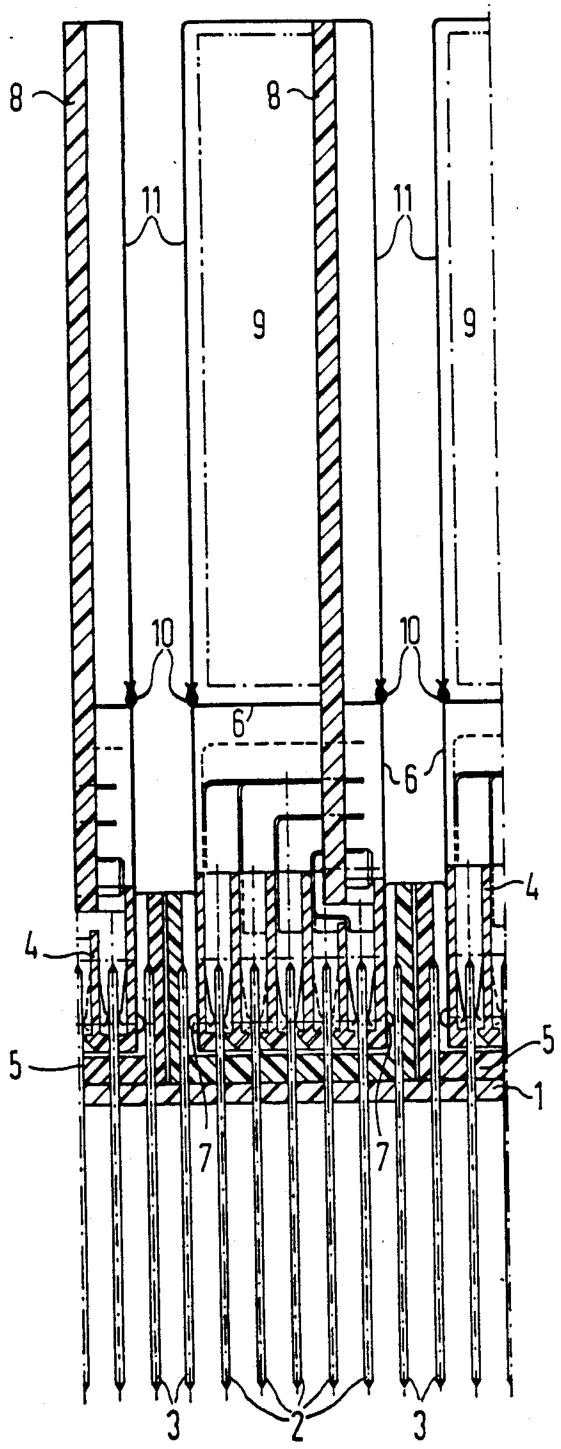
FIG. 1 is a cross-sectional side view of an exemplary embodiment of a shielding of an assembly which is plugged onto a wiring board and has spring elements at the shielding caps.

The exemplary embodiment of FIG. 1 shows a wiring board 1 having a plurality of contact blades 2, 3 oriented perpendicularly thereon. Multi-pole assembly plugs 4 at the assembly side plug onto correspondingly arranged contact blades 2. Those contact blades 3 that are electrically connected to a grounded potential layer present on the wiring board 1 are arranged between those regions of the contact blades 2 for the assembly plugs 4 that extend in a suitable spacing. Centering strips 5 that serve for the acceptance of the assembly plugs 4 are inserted between the wiring board 1 and the assembly plugs 4. The centering strips 5 are provided with clearances for the contact blades 2. The contact blades connected to the grounded potential layer of the wiring board 1 partially engage into corresponding recesses at the longitudinal interior of the centering strips 5.

Those regions of the contact blades 3 that emerge from the inside surfaces of the centering strip 5 extending parallel to the plug-in direction represent the contact surfaces for the electrical connection to the shielding caps 6 of the assembly plugs 4. The edges of the shielding caps 6 pointing in the direction of the wiring board 1 are fashioned as spring elements 7. These spring elements 7 located at the outer sides of the shielding caps 6 ar arced roughly hemispherically out and are pressed against the contact blades 3. As a result the shielding caps 6 of the assembly plugs 4 are electrically connected to the grounded potential layer of the wiring board 1 with a shortest possible path.

The shielding cap 6 surrounds the assembly plug 4 such that the former presses flush against those outside surfaces of the assembly plug 4 pointing in a plug-in direction. The assembly plugs 4 are attached to an assembly motherboard 8 by solder or by press-fit connections. Electrical components are located on the assembly motherboards 8 within the space 9 defined with dot-dash lines. Spring elements 10 are located at those edges of the outside surface of the shielding cap 6 facing toward the assembly motherboard side. These spring elements 10 can accept metallic shielding surfaces 11, fashioned, for example, as shielding plates, that extend parallel to the upper side and under side of the assembly board. For example, the spring elements 10 are each formed by two spring strips that are mirror image symmetrically arranged relative to one another and each of which is first shaped hemispherically outward and subsequently shaped hemispherically inward. Several executions of the spring elements 10 are provided for the purpose of accepting the shielding plates 11, for instance a single spring element (shaped as set forth) extending over the entire assembly. The fastening of the shielding plates 11 to the assembly partly occurs via the spring elements 10 and partly occurs via further mechanically releasable holding elements (not shown because they do not directly belong to the invention) that, for example, are again realized by spring elements.

Figure 2:
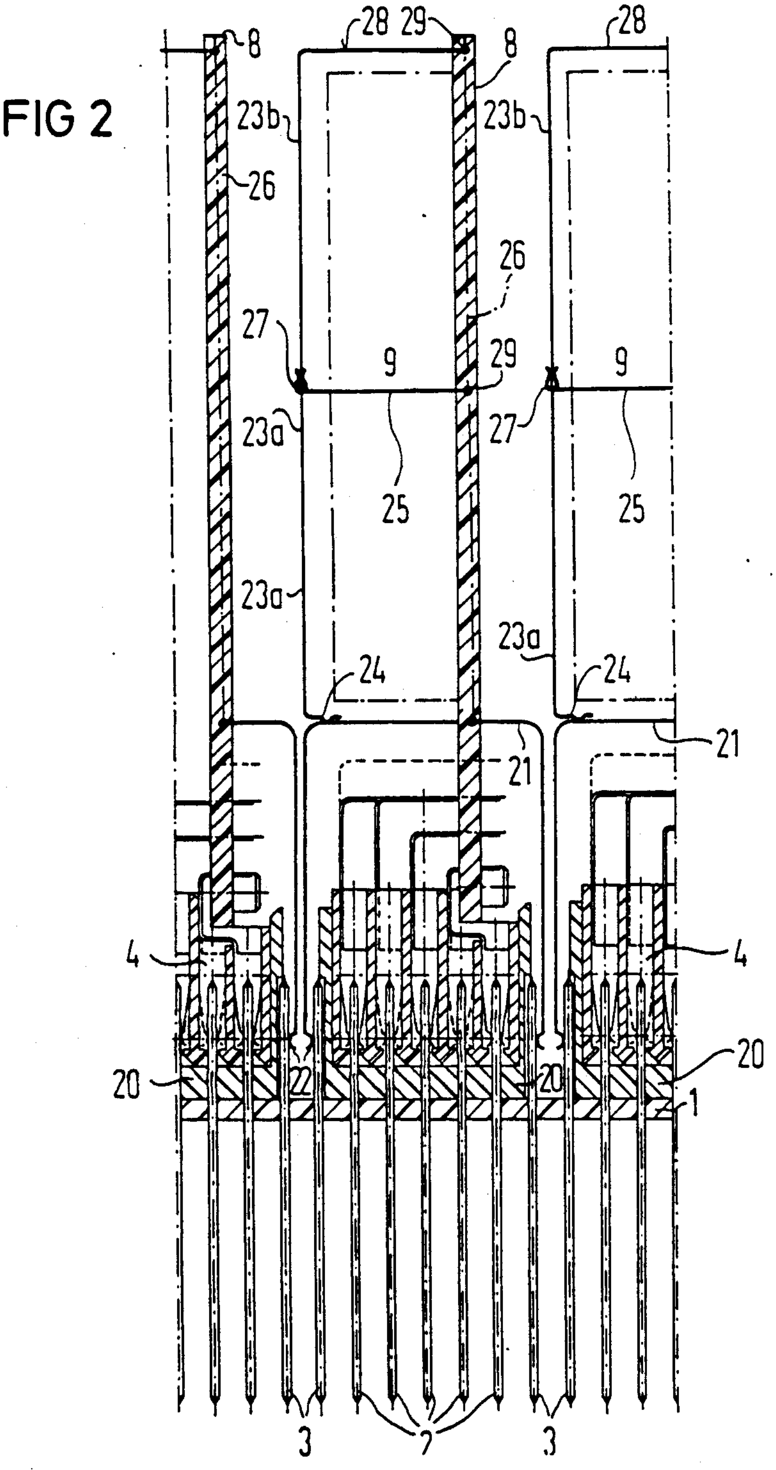
FIG. 2 is a cross-sectional side view of an exemplary embodiment of a shielding of an assembly which is plugged onto a wiring board and has spring elements at shielding surfaces of the assembly that are divided into shielding sub-surfaces.

FIG. 2 also shows a wiring board 1 having a plurality of contact blades 2, 3 oriented perpendicularly. Multi-pole assembly plugs 4 are plugged on correspondingly arranged contact blades 2 at the assembly side. Centering strips 20 providing for the acceptance of the assembly plugs 4 are arranged between the assembly plugs 4 and the wiring board 1. The centering strips 20 are provided with clearances for the contact blades 2. The contact blades 3 electrically connected to the grounded potential layer of the wiring board 1 partly engage into corresponding recesses at the longitudinal outer sides of the centering strips 20. Those regions of the contact blades 3 that emerge from those outside surfaces of the centering strip 20 extending parallel to the plug-in direction represent the contact surfaces for the electrical connection to shielding caps 21 of the assembly plug 4.

Those edges of the shielding cap 21 pointing in the direction of the wiring board 1 are fashioned as spring elements 22 that, arced roughly hemispherically inward, are arranged such that they resiliently press against the contact blades 3. The shielding caps 21 each almost completely envelop the assembly plug 4 including the centering strip 20. The assembly plugs 4 are in turn applied on an assembly motherboard 8 with a solder or press-fit connection. Electrical components are again located on the assembly motherboard 8 inside the space 9 identified with dot-dash lines.

At the components side, the assembly motherboard 8 is almost completely surrounded by shielding surfaces 23 that, for example, can be constructed with shielding plates. For the purpose of achieving a modular structure of the shielding surface 23, this is subdivided into, for example, two shielding sub-surfaces 23*a*, 23*b*. The first shielding sub-surface 23*a* following the shielding cap 21 has spring elements 24 at its edge facing toward the shielding cap 21. These spring elements 24 that, for example, are hemispherically shaped, are arranged such at the edge of the first shielding sub-surface 23*a* such that in the assembled condition of the first shielding sub-surface 23*a*, they press resiliently against that outside surface of the shielding cap 21 facing away from the wiring board 1. Several possible embodiments also exist for these spring elements 24. For example, a plurality of spring elements 24 can be fashioned at the edge of the first shielding sub-surface 23*a* or a single spring element 24 can be fashioned that extends over the entire width of the assembly. The first shielding sub-surface 23*a* extends over about half of the assembly motherboard 8. In this region, the first shielding sub-surface 23*a* is bent in the direction toward the assembly motherboard 8. The region 25 of the first shielding sub-surface 23*a* that thereby results and that extends approximately perpendicular to the assembly motherboard 8 need not be fashioned as a through shielding surface since a shielding of the components from one another within the assembly is not required in every instance. It is thus adequate to conduct this region 25 partially up to the wiring board 8. The end of the region 25 facing toward the assembly motherboard 8, for example, can be connected to the assembly motherboard 8 via retaining elements or, as shown in FIG. 2, can be connected via a soldered connection to a grounded potential layer 26 located in the assembly motherboard 8. For example, this grounded potential layer 26 is applied on the wiring side of the assembly motherboard 8 as uppermost layer. A shielding of the wiring side of the assembly is thereby achieved. Applying a shielding surface on the wiring side of the assembly motherboard 8 can thus be eliminated.

The first shielding sub-surface 23a is followed by a second shielding sub-surface 23b that almost completely surrounds the remaining components region 9 of the assembly motherboard 8. This second shielding sub-surface 23b is connected to the first shielding sub-surface 23a via further spring elements 27. These further spring elements 27 are located at that edge of the first shielding sub-surface 23a pointing away from the assembly plug 4 such that the second shielding sub-surface 23b can be inserted into these springs. For example, these spring elements 27 are shaped in conformity with the spring elements 10 of FIG. 1 and, in addition to serving for the voltaic connection of the two shielding sub-surfaces 23a, 23b, additionally serve for one-sided holding of the second shielding sub-surface 23b.

Analogous to the first shielding sub-surface 23a, this is respectively angled off in the edge region of the assembly motherboard 8 such that the angled regions 28 extend approximately perpendicular to the assembly motherboard 8. The voltaic connection and the holding of these regions is achieved, for example, by correspondingly arranged spring elements or, as disclosed in FIG. 2, by a solder connection 20, analogous to the region 25 of the first shielding sub-surface 23a, to the grounded potential layer 26 in the assembly motherboard 8.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A device shielding at least one electronic assembly, the device having at least one multi-pole plug, each plug having a shielding cap which is provided with spring elements that, in a plugged-in condition of the plug, press against contact elements oriented perpendicularly on a wiring board, the contact elements being connected to a grounded potential layer of the wiring board, said device further comprising metallic shielding surfaces said surfaces not covering any portion of the at least one plug, at least partially surrounding each electronic assembly, said surfaces being voltaically connected to each shielding cap with metallic connecting elements.

2. The device according to claim 1, wherein the contact elements are contact blades.

3. The device according to claim 1, wherein the metallic connecting elements are located at each shielding cap and at each metallic shielding surfaces.

4. The device according to claim 1, wherein the metallic connecting elements are mechanically releasable.

5. The device according to claim 4, wherein the metallic connecting elements are spring elements that resiliently press against each metallic shielding surface.

6. The device according to claim 1, wherein each shielding cap has outside shielding surfaces, and wherein the metallic shielding surfaces of each assembly and the outside shielding surfaces of each shielding cap are sections of a single unit, one such unit provided for an under side of each assembly and another such unit provided for an upper side of each assembly.

7. The device according to claim 1, wherein the metallic shielding surfaces are subdivided into shielding sub-surfaces for the purpose of a modular expansion; and wherein the shielding sub-surfaces are each equipped with additional metallic connector elements mated to one another so that all shielding sub-surfaces are voltaically connected to one another.

8. The device according to claim 1, wherein each shielding cap is equipped with at least one further metallic connector element such that a further shielding surface located in an assembly motherboard, to which each assembly is attached, is voltaically connected to each shielding cap.

9. The device according to claim 8, wherein the further metallic connector element is a spring element located at the further shielding surface of the assembly motherboard.

10. The device according to claim 1, wherein the contact elements are reinforcing plates.

11. The device according to claim 1, wherein the metallic connecting elements are located at each shielding cap.

12. The device according to claim 1, wherein the metallic connecting elements are located at each metallic shielding surface.

13. The device according to claim 4, wherein the metallic connecting elements are spring elements that resiliently press against each shielding cap.

14. The device according to claim 1, wherein the metallic shielding surfaces of each assembly are equipped with at least one further metallic connector element such that a further shielding surface located in an assembly motherboard, to which each assembly is attached, is voltaically connected to the metallic shielding surfaces of each assembly.

15. The device according to claim 8, wherein the further metallic connector element is a spring element located at the metallic shielding surface of each assembly.

16. The device according to claim 8, wherein the further metallic connector element is a solder element located at the further shielding surface of the assembly motherboard.

17. The device according to claim 8, wherein the further metallic connector element is a solder element located at the metallic shielding surface of each assembly.

18. The device according to claim 14, wherein the further metallic connector element is a spring element located at the further shielding surface of the assembly motherboard.

19. The device according to claim 14, wherein the further metallic connector element is a spring element located at the metallic shielding surface of each assembly.

20. The device according to claim 14, wherein the further metallic connector element is a solder element located at the further shielding surface of the assembly motherboard.

21. The device according to claim 14, wherein the further metallic connector element is a solder element located at the metallic shielding surface of each assembly.

* * * * *